(12) United States Patent
Mousavian et al.

(10) Patent No.: US 12,027,449 B2
(45) Date of Patent: Jul. 2, 2024

(54) DEVICE TOPOLOGIES FOR HIGH CURRENT LATERAL POWER SEMICONDUCTOR DEVICES

(71) Applicant: GaN Systems Inc., Kanata (CA)

(72) Inventors: Hossein Mousavian, Kanata (CA); Edward Macrobbie, Nepean (CA)

(73) Assignee: GAN SYSTEMS INC., Ottawa (CA)

( * ) Notice: Subject to any disclaimer, the term of this patent is extended or adjusted under 35 U.S.C. 154(b) by 0 days.

(21) Appl. No.: 17/974,794

(22) Filed: Oct. 27, 2022

(65) Prior Publication Data

US 2023/0050580 A1 Feb. 16, 2023

Related U.S. Application Data

(63) Continuation of application No. 17/085,137, filed on Oct. 30, 2020, now Pat. No. 11,527,460.

(51) Int. Cl.
*H01L 29/417* (2006.01)
*H01L 23/482* (2006.01)
(Continued)

(52) U.S. Cl.
CPC ...... *H01L 23/4824* (2013.01); *H01L 29/2003* (2013.01); *H01L 29/41758* (2013.01); *H01L 29/7786* (2013.01); *H01L 29/8611* (2013.01)

(58) Field of Classification Search
CPC ............... H01L 23/4824; H01L 23/528; H01L 23/5226; H01L 29/2003; H01L 29/41758;
(Continued)

(56) References Cited

U.S. PATENT DOCUMENTS

| 8,791,508 B2 | 7/2014 | Roberts et al. |
| 9,029,866 B2 | 5/2015 | Roberts et al. |

(Continued)

OTHER PUBLICATIONS

Dixit, et al.; Advanced Packaging; "Wire Bonding Considerations; Design Tips for Performance and Reliability"; Jul. 2006; 4 pages.
(Continued)

*Primary Examiner* — Eric A. Ward
(74) *Attorney, Agent, or Firm* — WORKMAN NYDEGGER

(57) ABSTRACT

A lateral power semiconductor device structure comprises a pad-over-active topology wherein on-chip interconnect metallization and contact pad placement is optimized to reduce interconnect resistance. For a lateral GaN HEMT, wherein drain, source and gate finger electrodes extend between first and second edges of an active region, the source and drain buses run across the active region at positions intermediate the first and second edges of the active region, interconnecting first and second portions of the source fingers and drain fingers which extend laterally towards the first and second edges of the active region. External contact pads are placed on the source and drain buses. For a given die size, this interconnect structure reduces lengths of current paths in the source and drain metal interconnect, and provides, for example, at least one of lower interconnect resistance, increased current capability per unit active area, and increased active area usage per die.

13 Claims, 10 Drawing Sheets

(51) Int. Cl.
  *H01L 29/20* (2006.01)
  *H01L 29/778* (2006.01)
  *H01L 29/861* (2006.01)

(58) Field of Classification Search
  CPC ............. H01L 29/7786; H01L 29/8611; H01L 29/778; H01L 2224/0603; H01L 2224/49111
  See application file for complete search history.

(56) References Cited

U.S. PATENT DOCUMENTS

| | | | |
|---|---|---|---|
| 9,331,572 B2 * | 5/2016 | Inada | H01L 25/072 |
| 9,654,001 B2 * | 5/2017 | Ujita | H01L 23/535 |
| 9,659,854 B2 | 5/2017 | Klowak et al. | |
| 10,218,346 B1 | 2/2019 | Mizan et al. | |
| 10,529,802 B2 | 1/2020 | Mizan et al. | |
| 11,515,235 B2 | 11/2022 | Mizan | |
| 11,527,460 B2 * | 12/2022 | Mousavian | H01L 29/2003 |
| 2004/0119154 A1 | 6/2004 | Briere | |
| 2009/0108459 A1 * | 4/2009 | Motoyui | H01L 23/4824 257/773 |
| 2011/0241126 A1 | 10/2011 | Herberholz | |
| 2014/0103537 A1 * | 4/2014 | Kaibara | H01L 23/53238 257/773 |
| 2016/0087074 A1 * | 3/2016 | Prechtl | H01L 23/53238 438/652 |
| 2018/0026125 A1 | 1/2018 | Liao et al. | |
| 2019/0081141 A1 | 3/2019 | Mizan et al. | |
| 2019/0386128 A1 | 12/2019 | Lin et al. | |
| 2020/0091291 A1 | 3/2020 | Mizan et al. | |

OTHER PUBLICATIONS

Reiner, Richard; "Design and Characterization of Highly-Efficient GaN-HEMTs for Power Applications"; Nov. 2006; 147 pages.

* cited by examiner

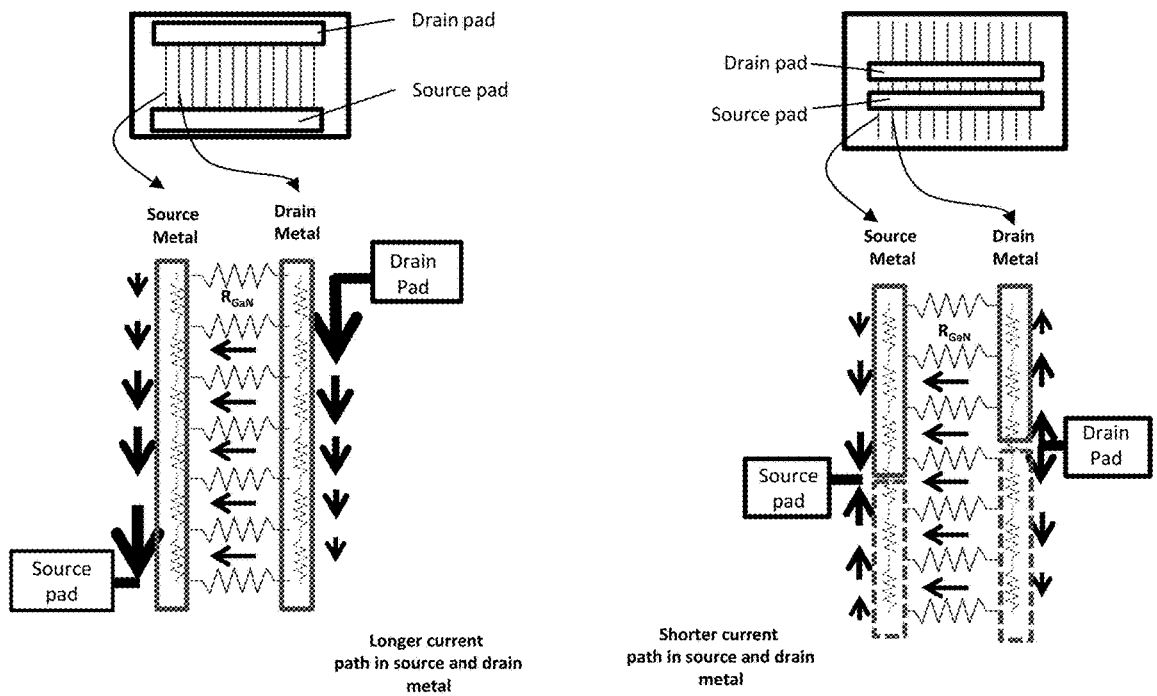
Fig. 3 (Prior Art)             Fig. 4
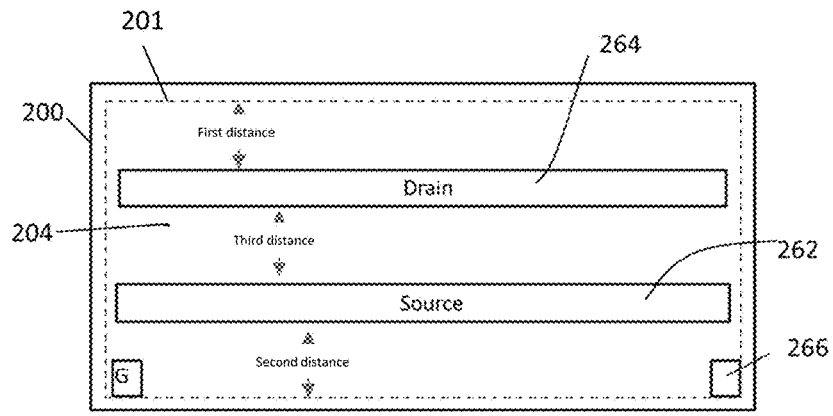
Fig. 5

DEVICE TOPOLOGIES FOR HIGH CURRENT LATERAL POWER SEMICONDUCTOR DEVICES

CROSS-REFERENCE TO RELATED APPLICATION(S)

This application is a continuation of U.S. patent application Ser. No. 17/085,137 filed Oct. 30, 2020, entitled "Device Topologies for High Current Lateral Power Semiconductor Devices", which is incorporated herein by reference in its entirety.

This application is related to U.S. patent application Ser. No. 16/688,808 filed Nov. 19, 2019, entitled "Scalable Circuit-Under-Pad Device Topologies for Lateral GaN Transistors", which is incorporated herein by reference in its entirety.

This application is related to U.S. patent application Ser. No. 17/117,449 filed Dec. 10, 2020, entitled "Device Topologies for Lateral Power Transistors with Low Common Source Inductance", which is incorporated herein by reference in its entirety.

TECHNICAL FIELD

This invention relates to device topologies for high current lateral power switching devices, with particular applications to power switching systems comprising high current lateral GaN power transistors and diodes.

BACKGROUND

In the context of this disclosure, Circuit-Under-Pad, or CUP, refers to semiconductor device topologies in which metal contact pads are provided over areas of underlying active devices or active integrated circuitry. The metal pads are defined by one or more on-chip conductive metallization layers and provide for die-to-package interconnections which are distributed over the active device area. The pads are vertically interconnected to the underlying regions of the active circuitry, e.g. using a plurality of micro-vias. In contrast, in traditional, non-CUP, device topologies, on-chip metal interconnect, comprising conductive tracks, laterally interconnects active device areas to busses placed between active device areas, and external contact pads to the buses are provided, typically arranged around the periphery of the chip. However, in the latter structures, the metal interconnect buses and contact pads are provided on inactive regions of the chip, which take up significant area in between active device regions and/or around edges of the die, limiting the usable fraction of the die area that is available for the active device area.

For wirebonded packaging, CUP device structures may also be referred to as Bondpad-Over-Active device structures. CUP device structures are effective in increasing the usable fraction of die area available for active circuitry, and potentially provide for physical and electrical shielding of underlying circuitry, and more planar encapsulation. On the other hand, for application to power switching devices, such as high-current lateral GaN transistors, known implementations of CUP device topologies have one or more limitations. Performance considerations for high current power switching devices include increasing current carrying capability per unit device area, and reducing on-chip parasitic impedances, i.e. parasitic resistances, inductances and capacitances.

Improved or alternative device topologies and packaging solutions for high current, lateral GaN transistors are disclosed, for example, in United States patent application No. U.S. Ser. No. 15/704,458, entitled "High Current Lateral GaN Transistors with Scalable Topology and Gate Drive Phase Equalization", now U.S. Pat. No. 10,218,346 issued Feb. 26, 2019; and in U.S. patent application Ser. No. 15/988,453, filed May 24, 2019, now U.S. Pat. No. 10,529,802, entitled "Scalable Circuit-Under-Pad Device Topologies for Lateral GaN Power Transistors".

The above referenced patents and patent applications are incorporated herein by reference in their entirety.

As described in the above referenced patents and patent applications, and references cited therein, high current lateral GaN power transistors may be formed on a large area die comprising multiple transistor elements which are connected in parallel, i.e. to provide a scalable, large gate width, device with appropriate current carrying capacity. These transistor elements may be referred to as transistor sections or islands. For improved performance, it is desirable to reduce parasitic impedances and interconnect impedances of the power switching device and the device packaging. For example, parasitic resistances of high current, lateral GaN power transistors includes the source-drain resistance of each 2DEG channel region between the source and drain electrodes, and the resistance of the on-chip metal interconnect, which interconnects each source and drain electrodes and the external contact pads. For some types of semiconductor switching devices, the Rds and Rdson of the channel region may dominate, and resistance of the on-chip metal interconnect may not contribute significantly to total device resistance.

However, for some power FETS, such as lateral GaN power transistors, e.g. GaN HEMTs, the parasitic resistance of on-chip metal interconnect may account for a significant fraction, e.g. up to 30%, of the total device resistance. For example, for conventional device topologies configured for wirebonded packaging, where source, drain and gate contact areas (bond pads) are provided around the periphery of the die for convenience of wirebonding, the length of on-chip source and drain interconnect metal may contribute a significant amount of resistance relative to package resistance, i.e. wirebond resistance. For high current devices, reducing parasitic resistances helps to reduce resistive losses (thermal losses) and improve efficiency. For example, high current power switching devices may be priced based on current carrying capacity and resistance. Thus, for high current lateral GaN power switching devices, it is desirable to reduce parasitic impedances, such as on-chip interconnect resistance, and/or increase the current capacity per unit area. There is also a need for a low-cost solution for reduced on-chip interconnect resistance in a power switching device which could be packaged in a low-cost wire-bonded package.

Thus, there is a need for improved or alternative device topologies for high current, power semiconductor devices, which mitigate or circumvent one or more limitations of known device topologies, particularly for application to power switching systems comprising high current lateral GaN power transistors.

SUMMARY OF INVENTION

The present invention seeks to provide improved or alternative device topologies for lateral power semiconductor devices, which are particularly applicable for power switching devices and power switching systems comprising high current, lateral GaN power transistors.

A first aspect of the invention provides power semiconductor device structure comprising a lateral GaN HEMT wherein:
- drain, source and gate finger electrodes of the lateral GaN HEMT extend between first and second edges of an active region of a substrate,
- a drain interconnect metal finger contacts each drain finger electrode;
- a source interconnect metal finger contacts each source finger electrode;
- source and drain buses run across the active region at positions intermediate the first and second edges of the active region,
- the source bus interconnects first and second portions of each of the source interconnect metal fingers which extend laterally towards the first and second edges of the active region;
- the drain bus interconnecting first and second portions of each of the drain interconnect metal fingers which extend laterally towards the first and second edges of the active region;
- a source contact pad is provided on the source bus;
- a drain contact pad is provided on the drain bus; and
- a gate bus interconnects gate finger electrodes to a gate pad.

The positions of the source bus and drain bus are centralized on the active region, e.g. at positions intermediate the first and second edges of the active region which are on a central region, spaced each side of a centreline of the active region.

For example, the source bus and the drain bus run across a central region the active region, and the source contact pad and the drain contact pad are separated by a distance which is at least a minimum specified distance to comply with creepage requirements for a rated operational voltage. In example embodiments, the source bus and the drain bus run across a central region of the active area, the source contact pad being spaced a first distance from the first edge and the drain contact pad being spaced a second distance from the second edge, said first and second distances being a significant part of a distance between the first and second edges of the active region to meet a design requirement for a resistance of the source and drain interconnect metallization. The source bus and the drain bus may run across a central region of the active area, the source contact pad being spaced a first distance from the first edge and the drain contact pad being spaced a second distance from the second edge, said first and second distances being at least a width of the source contact pad and the drain contact pad.

The said first and second distances are optimized to reduce resistance of the source interconnect metal and drain interconnect metal while maintaining at least a minimum specified distance between the drain contact pad and the source contact pad to comply with creepage requirements for a rated operational voltage. For example, the rated operational voltage may be one of: ≥80V, ≥100V; ≥200V; ≥600V; and >1200V.

An example specified design requirement is to minimize resistances of the drain interconnect metal and source interconnect metal while maintaining at least a minimum specified distance between the drain contact pad and the source contact pad to comply with creepage requirements for the rated operational voltage.

For example, the source bus and the drain bus are positioned in a central region of the active area, the source bus being spaced a first distance from the first edge and the drain bus being spaced a second distance from the second edge, wherein said first and second distances are ≥20% of a distance between the first and second edges of the active region. The source bus and the drain bus are separated by a third distance which is at least a minimum specified distance for operation at a rated operating voltage of e.g. ≥100V or ≥650V. The third distance may also be selected to comply with design rules and other manufacturing constraints.

For example, current path lengths of the first and second portions of the drain metal interconnect and current path lengths of the first and second portions of the source metal interconnect are optimized to reduce resistance of both the source metal interconnect and the drain metal interconnect while maintaining at least a minimum specified distance between the drain contact pad and the source contact pad, e.g. to comply with design rules comprising a minimum source pad to drain pad separation to comply with creepage specifications for the rated operational voltage.

A second aspect of the invention provides a power semiconductor device structure, comprising at least one of a lateral power transistor and a lateral power diode, comprising:
- a substrate providing a device area;
- an active region formed on the device area;
- an array of a plurality of first finger electrodes and second finger electrodes on the active region, each first and second finger electrode extending in a first direction over the active region between first and second edges of the active region;
- first and second levels of interconnect metallization defining an interconnect structure comprising first interconnect fingers, second interconnect fingers, and a first bus and a second bus;
- each first interconnect finger contacting a first finger electrode and each second interconnect finger contacting a second finger electrode;
- the first bus extending in a second direction across the active region at a position intermediate the first and second edges of the active region and interconnecting first and second portions of the first interconnect fingers which extend laterally towards the first and second edges of the active region;
- the second bus extending in the second direction across the active region at a position intermediate the first and second edges of the active region and interconnecting first and second portions of the second interconnect fingers which extend laterally towards the first and second edges of the active region;
- a first contact pad formed on the first bus;
- a second contact pad formed on the second bus.

For example, the first bus extends across the active region spaced a first distance from the first edge of the active region;
- the second bus extends across the active region spaced at second distance from the second edge of the active region;
- the first bus and the second bus are spaced apart by a third distance.

wherein:
- the first and second distances place the first pad and the second pad in a central region of the active area between first and second edges, and the third distance provides at least a minimum required separation of the first pad and second pad for operation at a rated voltage.

Where the power semiconductor device structure comprises a lateral power transistor, third finger electrodes extend between adjacent first and second finger electrodes, the third finger electrodes being control electrodes of the lateral power transistor, and the interconnect structure comprises a third bus interconnecting the third finger electrodes to a third pad. The first, second and third finger electrodes may be are any one of: source, drain and gate; emitter, collector and gate; emitter, collector and base; source, collector and gate; anode, cathode and gate; and combinations thereof.

Where the power semiconductor device structure comprises a lateral power diode, the first and second finger electrodes are anode and cathode electrodes of the lateral power diode. For example, the lateral power transistor is a lateral GaN HEMT and the first, second and third finger electrodes are, respectively, drain, source and gate finger electrodes of the lateral GaN HEMT. Alternatively, the power semiconductor device structure of claim 10, wherein the lateral power diode is a lateral GaN diode.

A third aspect of the invention provides a power semiconductor device structure comprising a lateral GaN transistor comprising:
  a substrate providing a device area;
  an active region formed on the device area;
  an array of a plurality of source finger electrodes and drain finger electrodes on the active region, each source and drain finger electrode extending in a first direction over the active region between first and second edges of the active region, and gate finger electrodes extending between adjacent source and drain finger electrodes;
  first and second levels of interconnect metallization defining an interconnect structure comprising source interconnect fingers contacting the source finger electrodes and drain interconnect fingers contacting the drain finger electrodes, a source bus, a drain bus and a gate bus;
  the drain bus extending in a second direction across the active region at a position intermediate the first and second edges of the active region and interconnecting first and second portions of the drain interconnect fingers which extend laterally towards the first and second edges of the active region;
  the source bus extending in the second direction across the active region at a position intermediate the first and second edges of the active region and interconnecting first and second portions of the source interconnect fingers which extend laterally towards the first and second edges of the active region;
  the gate bus interconnecting the gate finger electrodes and having at least one contact area; a drain contact pad formed on the drain bus;
  a source contact pad formed on the source bus; and
  a gate contact pad formed on the at least one contact area of the gate bus.

For example, the drain bus extends across the active region spaced a first distance from the first edge of the active region;
  the source bus extends across the active region spaced at second distance from the second edge of the active region;
  the source bus and the drain bus are spaced apart by a third distance;
  wherein:
  the first and second distances place the source pad and the drain pad in a central region of the active area between first and second edges, and the third distance provides at least a minimum required separation of the external source pad and external drain pad for operation at a rated voltage.

The first and second distances are optimized to meet a specified design requirement for a resistance of the interconnect structure. For example, for a specified third distance, the first and second distances are optimized to minimize a resistance of the interconnect structure. For example, the specified design requirement may be to reduce or minimize current path lengths of the source and drain interconnect for a specified die size.

In an example embodiment:
  said first level of interconnect metallization defines:
  said source interconnect fingers and drain interconnect fingers, and
  a first part of the source bus interconnecting the source interconnect fingers;
  said second level of interconnect metallization defines:
  the drain bus interconnecting the drain interconnect fingers;
  a second part of the source bus contacting the first part of the source bus;
  the gate bus interconnecting the gate finger electrodes.

The drain bus may comprise lateral extensions that extend over and are interconnected to the drain interconnect fingers. The gate bus may run adjacent to the second part of the source bus and over a portion of the first part of the gate bus, the gate bus being interconnected to the gate finger electrodes by conductive vias which extend through openings in said portion of the first part of the source bus.

Thus, in example embodiments, the source bus and the drain bus are centralized, e.g. positioned in a central region of the active area, e.g. the source bus and the drain bus are positioned each side of a centreline of the active region. The drain bus extends across the active region at a first position spaced from the first edge of the active region; the source bus extends across the active region at a second position spaced from the second edge of the active region, and the source bus and the drain bus are spaced apart by a third distance.

Placement of the source bus and drain bus in a centre region of the active region allows for optimization of the on-chip source and drain interconnect impedances compared to a conventional arrangement where source and drain buses are placed near the periphery, i.e. close to the die edge, which may be an inactive area of the die. Conventional positioning of source and drain buses near the periphery of the chip may be done for various reasons, e.g. to facilitate wirebonding. Moving the source bus towards the centreline reduces the resistance of the source interconnect metal and moving the drain bus towards the centreline reduces the resistance of the drain interconnect metal. For example, the first and second distances are maximized to place the source and drain buses as close to the centreline as possible, to minimize source and drain resistances. For devices operating at high voltage, in practice, the third distance is selected to provide a required minimum separation between the source bus and drain bus, e.g. to comply with applicable design rules, and dependent on the operational voltage, e.g. to provide a minimum separation of ≥350 μm for 650V operation, so that the electric field between the source and drain contacts is maintained below a required threshold value. A greater separation may be required for clearance reasons, to comply with design rules or manufacturing limits. Thus, the appropriate first and second spacings for the source bus and the drain bus are selected to optimize or reduce on-chip interconnect resistances, while maintaining a required source bus-drain bus spacing for the specified operational voltage, and respecting other design rules, as appropriate. Positioning the source bus and drain bus closer to the centre region of the active area reduces both source and drain resistances. For example, the first, second and third distances may be approximately equal, so that the source and drain buses are symmetrically placed relative to the centreline.

For example, the drain bus and source bus are spaced from first and second edges of the die by first and second distances of at least 20% of the width of the active region, so that the source bus and the drain bus are provided on a centre (middle) region of the active region, e.g. the central 40% to 60% of the width of the active region. For wirebonded packaging, the source contact pads and drain contact pads may be, for example, 200 μm to 600 μm wide, depending on the size of the bond wires to be used.

In one example embodiment, e.g. for a die size of 3.5 mm by 1.75 mm, the source and drain buses are each 200 μm wide, and are spaced 450 μm from the first and second edges of the die, and the source and drain buses are spaced apart by a third distance of 500 μm. In other embodiments, provided a minimum separation of the source bus and drain bus for the required operational voltage is maintained, the source bus and drain bus are placed in the central region of the active region. These dimensions are given by way of example only.

Device topologies are provided for lateral power transistors wherein interconnect metallization is configured to reduce parasitic resistances; example embodiments are described having particular application for power switching devices and systems comprising large area, high current lateral GaN HEMTS. These device topologies are also applicable to lateral GaN diodes. These device topologies may also be applicable to lateral power semiconductor devices based on other semiconductor technologies having low on-resistances, where a conventional interconnect arrangement would contribute significantly to the total resistance of the die.

The foregoing and other features, aspects and advantages of the present invention will become more apparent from the following detailed description, taken in conjunction with the accompanying drawings, of some example embodiments of the invention, which description is by way of example only.

BRIEF DESCRIPTION OF THE DRAWINGS

In the drawings, identical or corresponding elements in the different Figures have the same reference numeral, or corresponding elements of have reference numerals incremented by 100 in successive Figures.

FIG. 3 (Prior Art) is a schematic diagram to illustrate current flow and voltage drop in the source and drain interconnect metal for a high current GaN power transistor with peripheral source and drain pads, such as illustrated schematically in FIGS. 1A, 1B, 2A and 2B;

FIG. 4 shows a schematic diagram to illustrate current flow and voltage drop in the source and drain interconnect metal for a high current GaN power transistor of an example embodiment with centralized source and drain pads;

FIG. 5 shows a simplified schematic diagram to illustrate an external plan view of a device structure comprising a device topology comprising an interconnect structure for a power transistor of a first embodiment, comprising centralized source and drain pads;

DETAILED DESCRIPTION

Figure 1A:
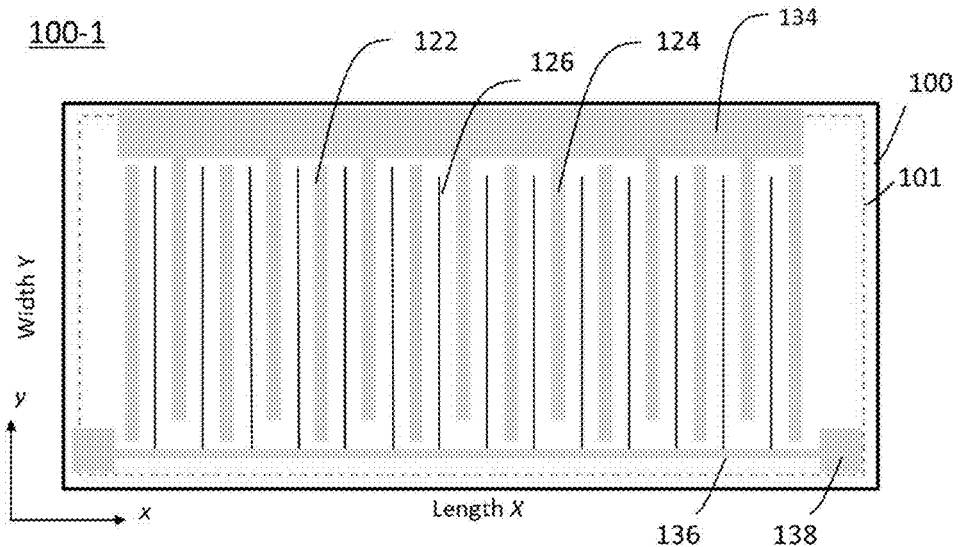
FIGS. 1A and 1B (Prior art) shows schematic diagrams to illustrate an interconnect topology of first and second levels of conductive metallization of a semiconductor device comprising a power transistor, wherein source, drain and gate buses are provided near edges of the device area (around periphery of the die)
Figure 1B:
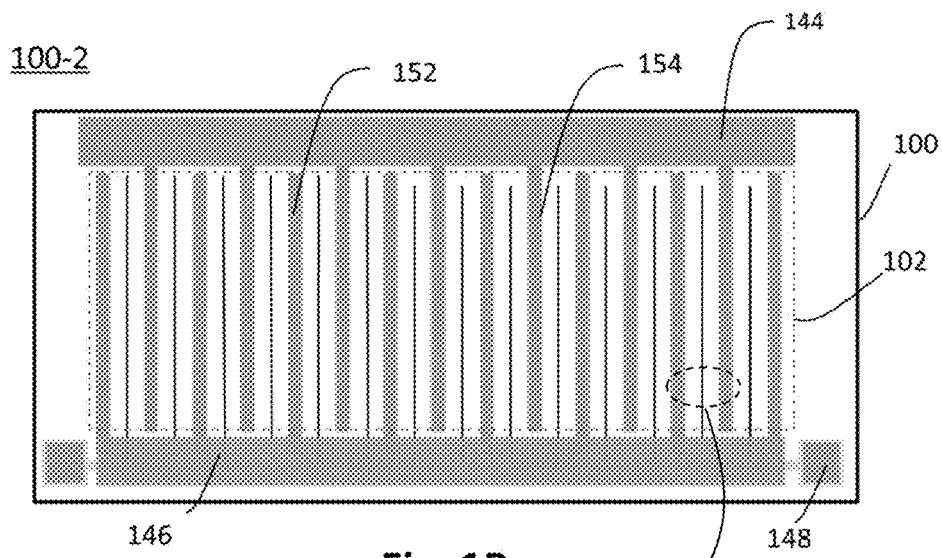
Figure 1C:
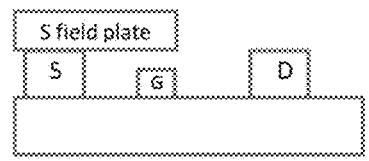
FIG. 1C shows a schematic-cross sectional diagram through a source finger electrode, a drain finger electrode and a gate finger electrode, wherein the source electrode comprises a source field plate.

FIGS. 1A and 1B (Prior art) show schematic diagrams to illustrate a device topology comprising a semiconductor die 100 defining a device area and first and second levels of metallization of a semiconductor device comprising a power transistor, wherein source, drain and gate buses are positioned near edges of the device area, i.e. around the periphery of the die 100. For example, for a lateral GaN power transistor, such as a GaN HEMT, an active region comprising a GaN/AlGaN heterostructure is formed on the device area of a semiconductor substrate. A first conductive layer, e.g. an ohmic contact layer, defines source finger electrodes and drain finger electrodes on the active area of the die, and a separate gate metal layer defines gate finger electrodes running between adjacent source and drain electrodes. At least first and second conductive interconnect metal layers are used to define an interconnect structure for the source, drain and gate fingers, comprising a source bus, a drain bus, and a gate bus, with interconnections between the conductive layers.

FIG. 1A shows a first plan view 100-1 to illustrate patterning of a first level of conductive interconnect metallization. An array of source finger electrodes 122 and drain finger electrodes 124 are defined on the active area, extending in a first direction across the width y of the active area. Gate finger electrodes 126 run between each adjacent source and drain finger electrode. In this example, the drain finger electrodes are connected to a drain bus 134 running along a first edge of the device area. Gate finger electrodes are connected to a gate bus 136 running along a second edge of the die. FIG. 1B shows a second plan view 100-2 to illustrate patterning of a second level of conductive interconnect metallization. The second level of metallization defines a source bus 142, drain bus 144, and gate contact areas 146. Lateral extensions (castellations) 152 extend from the source bus 142 and interconnect with the source finger electrodes 122 of the first level of metallization. Lateral extensions (castellations) 154 extend from the drain bus 144 and interconnect with the underlying drain finger electrodes 124 of the first level of metallization. First and second levels of metallization are separated by intermetal dielectric (not shown), and source, drain and gate interconnections between respective source, drain and gate parts of first and second levels of metallization are provided through openings in the intermetal dielectric, e.g. through conductive vias or microvias.

For simplicity, two levels of interconnect metallization are shown. Each level of interconnect metallization may comprise one conductive metal layer or multiple conductive metallization layers to provide conductive traces of a required thickness.

Figure 2A:
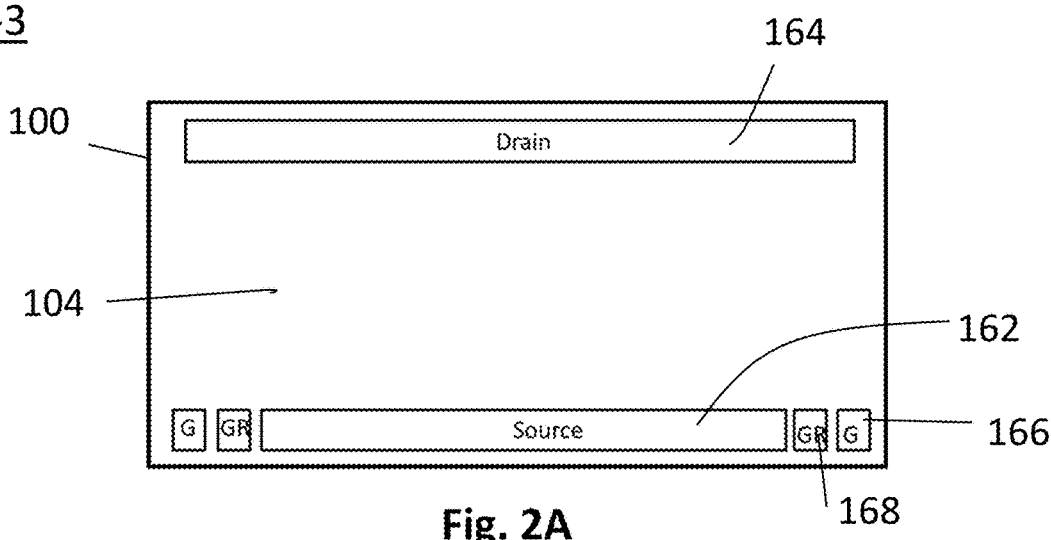
FIG. 2A (Prior art) shows a schematic plan diagram of a semiconductor device (die) comprising a power transistor having external contact pads for source, drain, gate and gate return connections.
Figure 2B:
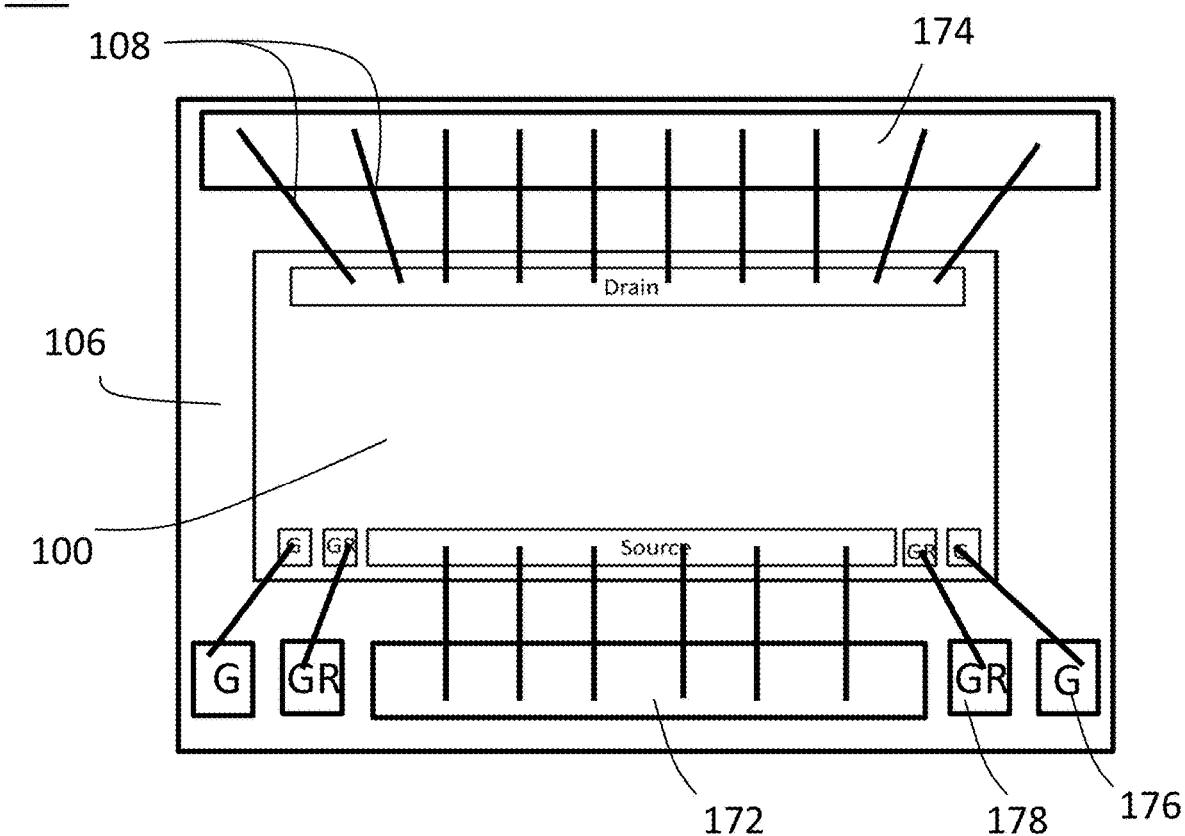
FIG. 2B (Prior art) shows a schematic diagram of part of a wirebonded package assembly comprising the semiconductor device of FIG. 2A mounted on a package substrate with wirebonded connections to respective source, drain, gate and gate return pads of the package substrate.

For a lateral power transistor such as shown in FIGS. 1A and 1B, a layer of pad metal defines the external source, drain contact and gate contact areas (pads), which are provided on a front-side of the die, as illustrated schematically in FIG. 2A (Prior art). The external contact areas may be called pads or lands, and for wirebonded packaging, they may be referred to as bondpads. FIG. 2A shows a schematic diagram of an external view 100-3 of the front side of a semiconductor device (die) 100 comprising the power transistor, showing the die passivation dielectric 104 with openings to the pad metal for an external contact pad for the source 162, an external contact pad for the drain 164, and dual gate contact pads 166 and gate return contact pads 168. FIG. 2B (Prior art) shows a schematic diagram of a plan view of part of a wirebonded package 103 comprising the semiconductor device 100 of FIG. 2A mounted on a package substrate 106 with a plurality of wirebonded connections 108 to the respective source pad 172, drain pad 174, gate pads 176 and gate return pads 178 of the package substrate 106.

For a lateral GaN power transistor in wirebonded package, the on-chip (die) metal interconnect and the package wirebonds contribute to parasitic inductances and resistances. For example, the device resistance includes the drain-source resistance of the channel region, and the resistance of the on-chip interconnect metal defining the source interconnect and drain interconnect. Wirebonds also contribute to parasitic resistances. For device topologies such as shown in FIGS. 1A, 1B, 2A and 2B, wirebonded packaging is widely available, and may be used for higher volume, lower cost packaging of power semiconductor devices.

To reduce wirebond interconnect resistance and inductances, multiple wirebonds, e.g. 25 to 35 wirebonds, may be provided to each of the source pads and drain pads, as illustrated schematically in FIG. 2B. By way of example, for 1.3 mil (37 μm) or 2 mil (50 μm) copper wirebonds, the parasitic wirebond resistance may be ~1 mΩ, e.g. in a range of 0.5 mΩ to 2.5 mΩ. For a power semiconductor device having device topology such as shown in FIGS. 1A, 1B, and 2A, on-chip (die) interconnect resistance per unit area may be several times higher, e.g. 4 to 6 times higher, and contribute significantly to overall device resistance.

For the general device topology illustrated in FIGS. 1A, 1B, and 2A, the source, drain and gate finger electrodes extend in a first direction, e.g. a y direction, across the width Y of the active area, and the source, drain and gate buses extend in a second direction, orthogonal to the first direction, e.g. an x direction, along the length X of the active area, to provide a device area having an aspect ratio of X:Y. The unit building block of this topology can be considered to be a cell or island comprising a plurality of source, drain and gate electrodes as illustrated schematically. The gate width $w_g$, and current carrying capacity, can be increased by increasing the length X of the active area. Gate width can also be increased by increasing the width Y of the active area. However, increasing the length of the source and drain fingers extending in the Y direction between the source and drain buses increases the resistance in proportion to the length, as illustrated schematically in FIG. 3 (Prior Art).

Example embodiments of device topologies are now described which provide for improved performance, e.g. to reduce interconnect resistance and/or to increase the current capacity per unit active area, and/or to reduce current density.

FIG. 3 is a schematic representation to illustrate current flow/voltage drop in the source and drain interconnect metal for a high current GaN power transistor as illustrated schematically in FIGS. 1A, 1B, 2A and 2B, where the source pad and gate pads are placed near edges of the die, so that the current path in the interconnect metal for each source finger and each drain finger is the entire width of the die. To increase the gate width $w_g$, and therefore increase the current carrying capacity of the chip, more cells or islands can be added in parallel in the x-direction, to increase the X-dimension. Higher current carrying capability per unit area with lower on-chip interconnect metal resistances requires a die having a higher aspect ratio X:Y (i.e. ratio of x-dimension to y-dimension).

Referring to FIG. 4, moving the drain pad and source pad towards the middle of the die effectively reduces the length of the current path in the source metal interconnect and drain metal interconnect, and therefore reduces the interconnect metal resistance. That is, across the width of the active region, each length of the source metal is divided in two portions and connected in parallel to the source pad, and each length of the drain metal is divided into two portions which are connected in parallel to the drain pad. Ideally, in this configuration the source pad and drain pads would be placed as close as possible to the centre of the die, i.e. close to the centre of each source and drain finger electrode. In practice, to comply with design rules, and for high voltage operation, e.g. ≥100V or ≥650V, at least a minimum specified separation must be maintained between the source and drain pads.

FIG. 5 and FIGS. 6A to 6D show simplified schematic diagrams to illustrate conceptually a device topology for a power transistor of a first embodiment comprising centralized source and drain pads, for reduced interconnect resistance, as explained with reference to FIG. 4.

FIG. 5 shows a schematic diagram of a semiconductor die 200 comprising a power transistor of a first embodiment, comprising a pad layout wherein the source pad 262 and the drain pad 264 extend across an intermediate region of the active region 201 of the device area. The source pad is spaced by a first distance from a first edge of the active region of the die, and the drain pad is spaced by a second distance from a second edge of the active region of die. The source and drain pads are spaced apart by a third distance.

FIGS. 6A to 6D shows a simplified schematic diagram to illustrate conceptually an implementation of a semiconductor device 200 of the first embodiment. The semiconductor die comprises a substrate providing a device area, on which is provided an active region 201. For example, for a GaN HEMT, an active area 201 is provided by a GaN/AlGaN heterostructure that provides an active region comprising a 2DEG channel. Source, drain and gate electrodes are defined on the active region 201. For example, a first conductive layer, e.g. an ohmic contact layer, defines source finger electrodes and drain finger electrodes extending in a first direction across a width of an active region between first and second edges of the die. A gate metal layer defines gate finger electrodes extending between the source and drain finger electrodes. An interconnect structure, comprising source, drain and gate interconnects, is defined by first and second levels of interconnect metallization, and respective intermetal dielectric layers. The source, drain and gate interconnects are interconnected to respective underlying source, drain and gate finger electrodes. In this example embodiment, as illustrated schematically in FIG. 6A, a first level of interconnect metal (light gray) is patterned to define source metal contacts 222, drain metal contacts 224 and gate metal contacts 226 for the source, drain and gate finger electrodes, respectively. As illustrated schematically in FIG. 6B, a second level of interconnect metal (dark grey) is patterned to provide a source bus 242, a drain bus 244, and a gate bus 246 with gate pads 266. The first and second levels of interconnect metallization are separated as appropriate by one or more intermetal dielectric layers 204, with conductive vias providing interconnections between first and second interconnect metallization layers.

Figure 6A:
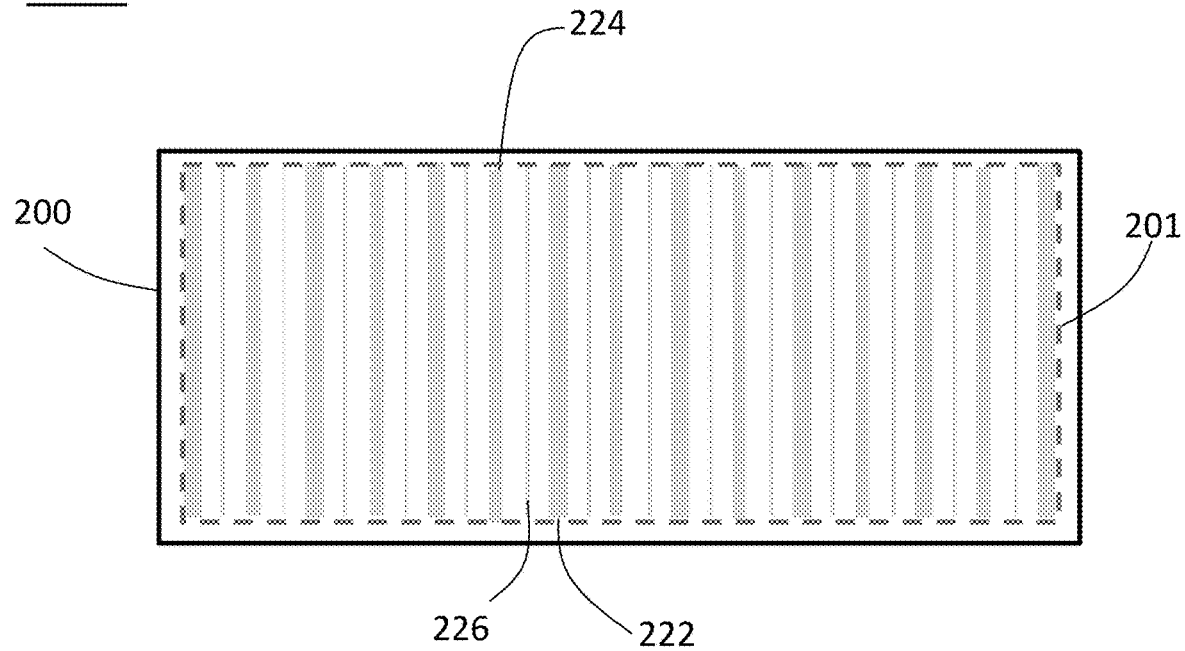
FIGS. 6A to 6D show a simplified schematic diagrams to illustrate conceptually fabrication of a device structure comprising an interconnect topology for a power transistor of a first embodiment.
Figure 6B:
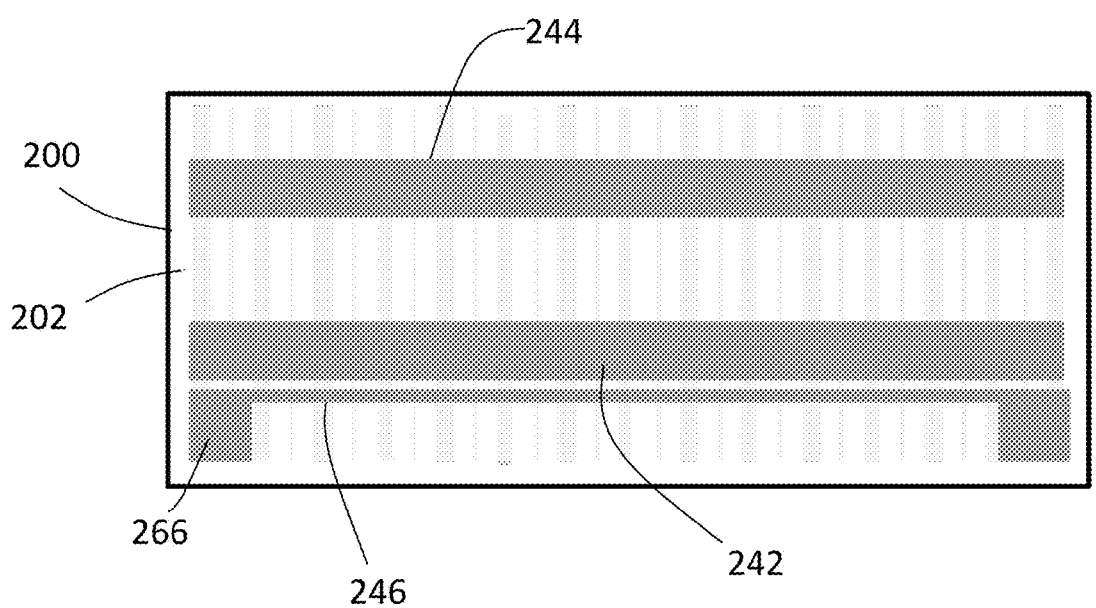
Figure 6C:
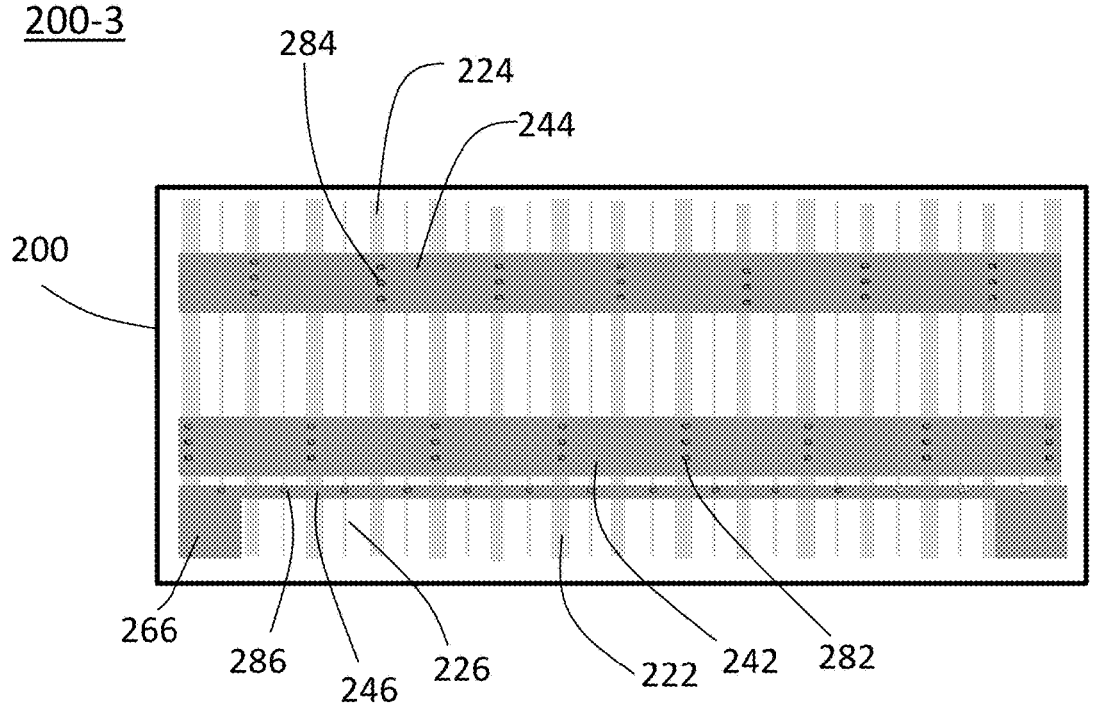
Figure 6D:
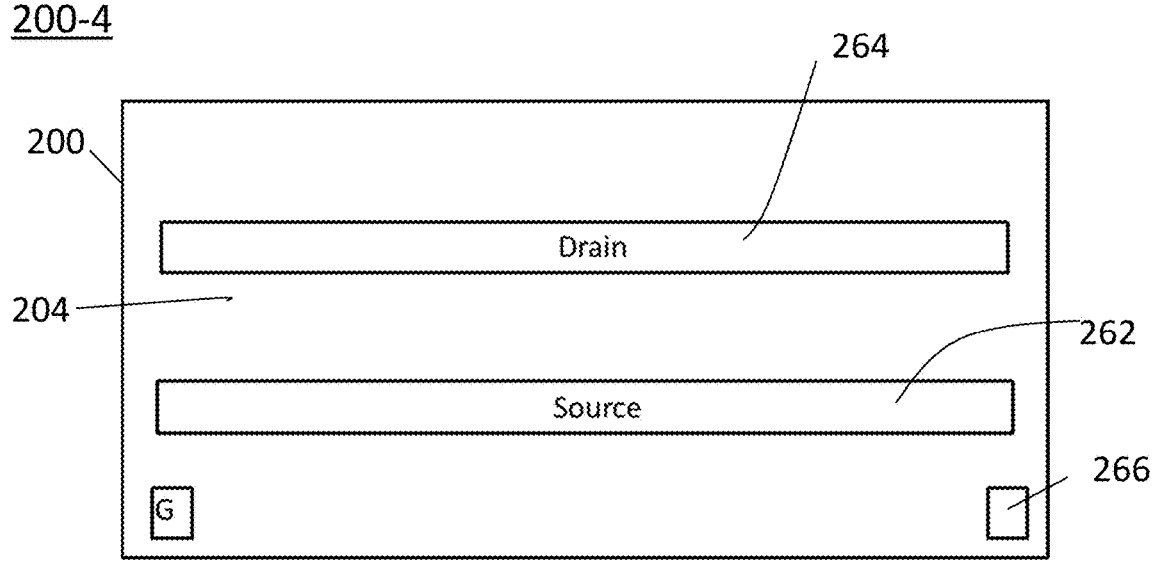

FIG. 6C illustrates schematically an overlay of the first and second level interconnect layers shown in FIGS. 6A and 6B. The drain bus 244 of the second level metal is interconnected by conductive vias 284 to the first level metal which provides contacts to the underlying drain finger electrodes. The source bus 242 of the second level metal is interconnected by conductive vias 282 to the first level metal that provides contacts to the underlying source finger electrodes. The gate bus 246 of the second level metal is interconnected by conductive vias 286 to the first level metal that provides contacts to the underlying gate finger electrodes 226. Each level of metallization may comprise one or more metal layers, to build up the source, drain and gate interconnect structures to the required thicknesses and lateral dimensions.

As illustrated schematically in FIG. 5, after completion of the interconnect structure, the die is passivated by adding a die passivation layer 204, through which openings are formed to define areas for external contacts for the drain, source and gate. Pad metal is provided directly on the drain bus and source bus to provide external source and drain contact pads. Pad metal is provided on the gate contact areas to provide external contact gate pads. In this embodiment, each of the source pad, the gate pad and the dual gate pads are provided over the active device area. For a die which is to be packaged in a wirebonded package, the external contact pads may be referred to as bondpads, and the die may be referred to as having a bondpad-over-active topology.

Figure 7A:
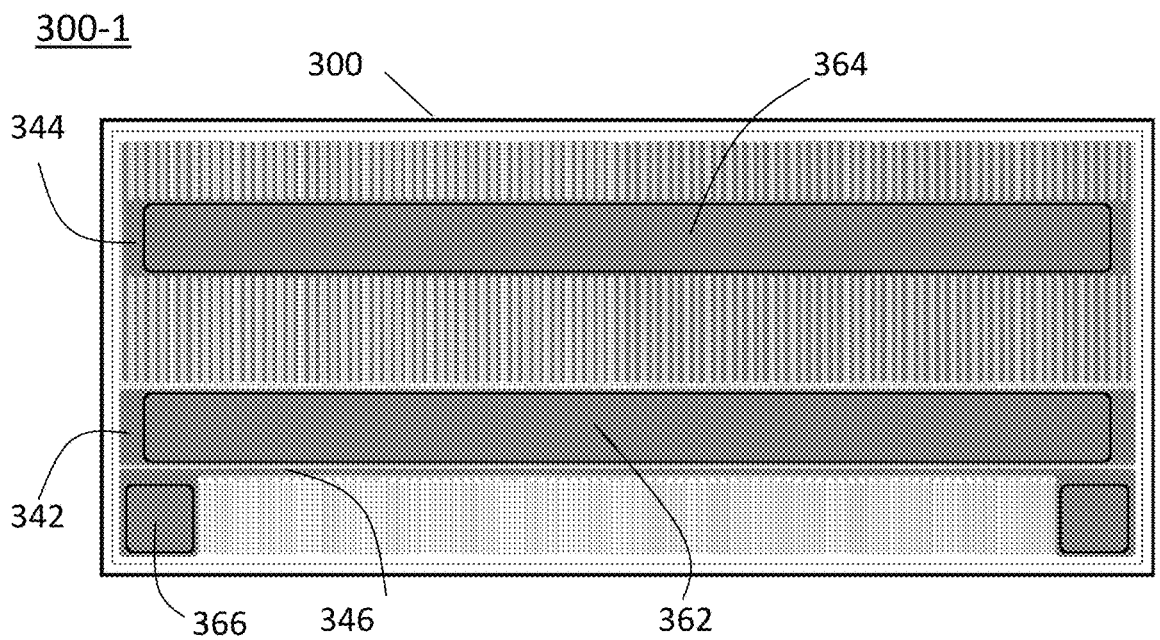
FIG. 7A shows a schematic diagram of an example device topology for implementing a power transistor of a second embodiment, showing an overlay of conductive layers comprising source, drain and gate finger electrodes and a source bus, a drain bus, and a gate bus and respective external contact areas.
Figure 7B:
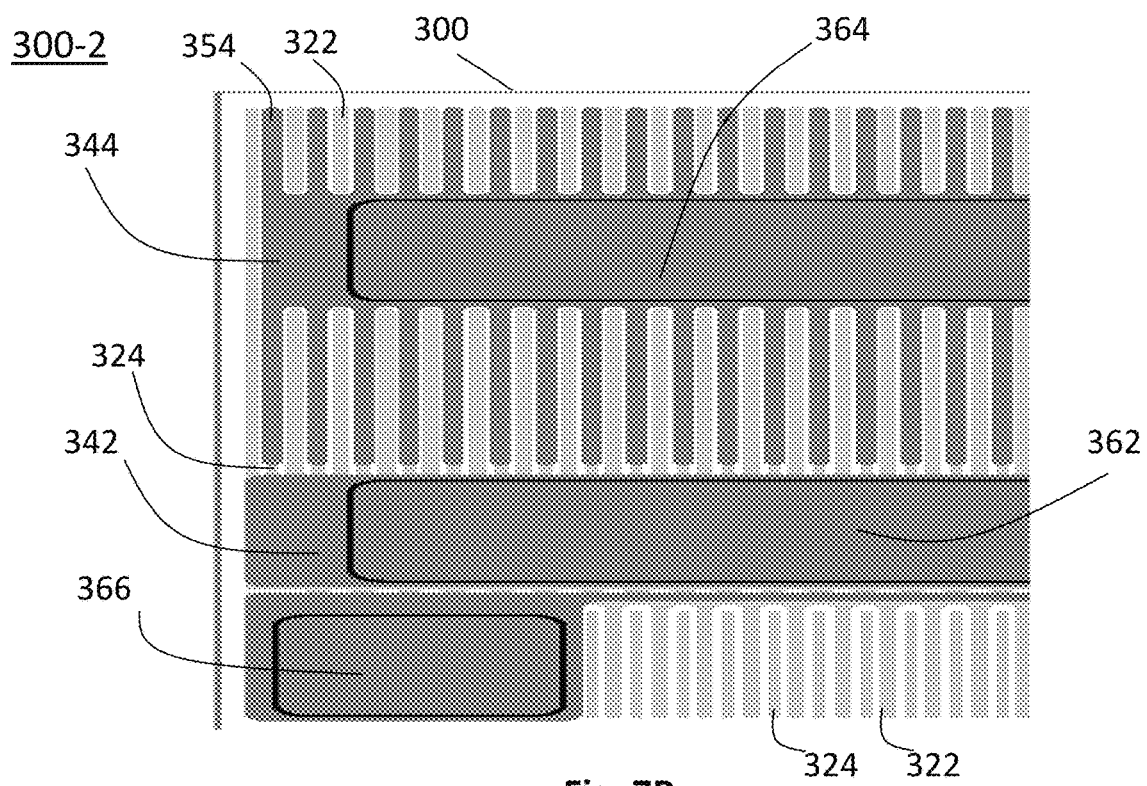
FIG. 7B shows an enlarged (laterally stretched out) view of part of FIG. 7A.

FIG. 7A shows a schematic diagram of a plan view 300-1 of an example device topology for implementing a power transistor of a second embodiment, showing an overlay of metallization layers comprising source, drain and gate finger electrodes, a source bus 342, a drain bus 344, and a gate bus 346, and respective external contact areas (pads) 362, 364, and 366 for the source, drain, and gate. FIG. 7B show an enlarged (laterally stretched out) view of part 300-2 of the device structure shown in FIG. 7A in which corresponding parts are labelled with the same reference numeral. In this embodiment, as illustrated schematically, the second level metallization that defines the drain bus 344 is patterned to define lateral extensions (castellations) 354 that extend over, and provide contacts to, the underlying drain fingers 324. The lateral extensions 354 of the drain bus provide a more robust drain interconnect structure, which builds up the thickness of the drain fingers for improved current capacity and assists with distributing drain current laterally to the underlying drain finger electrodes, in both directions, i.e. towards both first and second edges of the active region. In this embodiment, the source bus 342 is provided by the second level of metallization does not include lateral extensions. The current carrying capability of the source bus is helped by its interconnection to underlying source metallization comprising a source bus provided by the first level of metallization, which does include lateral extensions of the source interconnect metal which connect to the source finger electrodes. The gate bus is interconnected to the underlying gate finger electrodes through openings in the underlying first level source metallization.

FIGS. 8A, 8B, 8C, 8D and 8E, show schematic diagrams of a semiconductor device structure 400 comprising a lateral GaN power transistor having device topology of another example embodiment. As illustrated schematically in FIG. 8A, an active region 402, comprising a GaN/AlGaN heterostructure is provided on the device area of the die 400. In this embodiment, the active region 402 comprises two areas as illustrated schematically by the dashed outlines. A first conductive layer, e.g. an ohmic contact layer, is patterned to define a plurality of source finger electrodes 412 and drain finger electrodes 414, which extend in a first direction across a width of the active area, between first and second edge of the active region. As illustrated schematically in FIG. 8B, an auxiliary level of metal comprising a gate metal layer defines gate finger electrodes 416 that run between each adjacent source and drain finger electrode. This gate metal layer may be referred to as Metal 0. The active region 402 may extend close to the edges of the die, to maximize use of the device area, and e.g. provide a large gate width per unit device area.

Figure 8A:
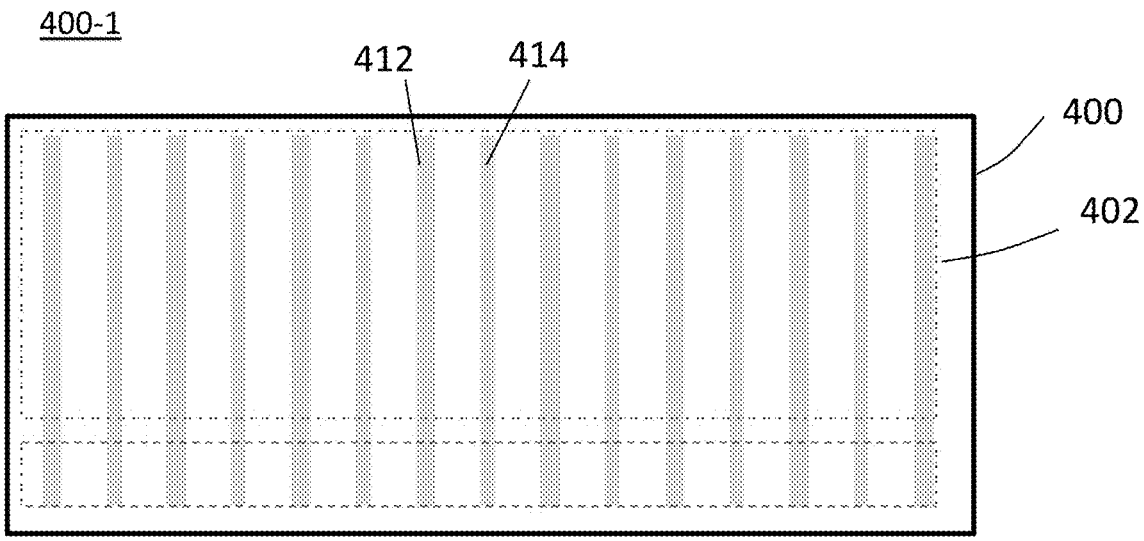
FIGS. 8A, 8B, 8C, 8D and 8E show schematic diagrams representing layer structures for implementing a semiconductor device structure comprising a lateral GaN power transistor having a device topology of a third embodiment comprising a plurality of conductive metallization layers comprising first and second levels of interconnect metallization.
Figure 8B:
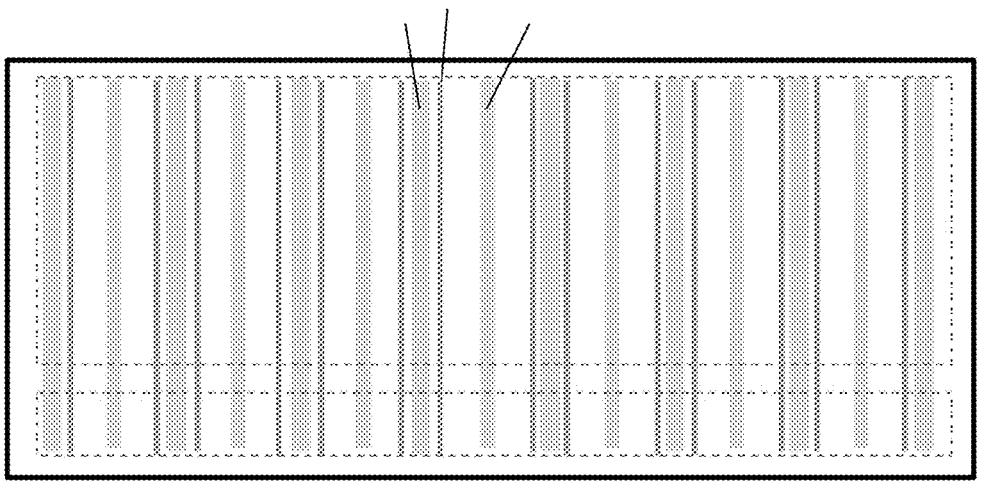
Figure 8C:
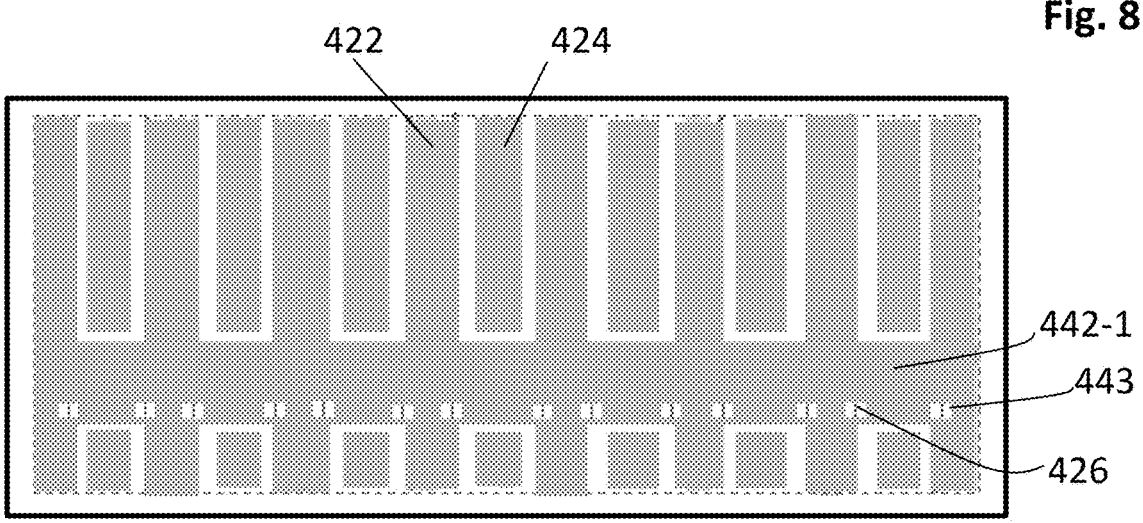
Figure 8D:
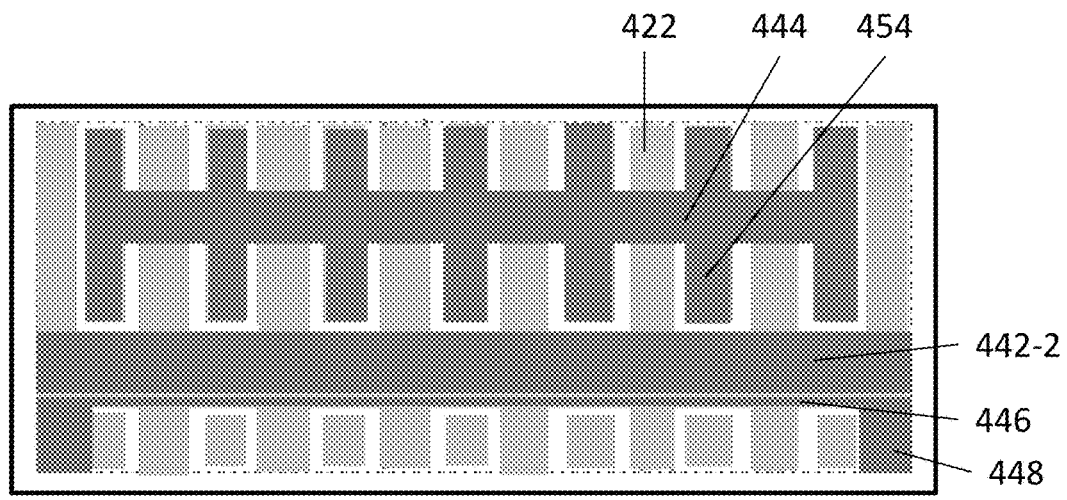

As illustrated schematically in FIG. 8C, a first level of interconnect metallization, which may be referred to as Metal 1, is patterned to provide source and drain interconnect structures comprising source fingers 422 and drain fingers 424. The first level of interconnect metallization also provides a source bus 442-1 which interconnects the source fingers. The source fingers run over the gate finger electrodes. Since the source metal 442-1 overlies the gate electrodes, openings are provided in the source bus 442-1 so that conductive vias can be provided through the source bus 442-1 to the underlying gate electrodes. As illustrated schematically in FIG. 8D, a second level of interconnect metallization (Metal 2) is patterned to provides a drain bus 444, a source bus 442-2 and a gate bus 446. FIG. 8D represents an overlay of Metal 1 shown in light grey and Metal 2 shown in darker grey. The respective source, drain and gate interconnect structures of the different layers of metallization are interconnected through intervening intermetal dielectric layers by conductive vias (not shown). In this embodiment, the drain bus 444 comprises lateral extensions (fingers or castellations) 454 that extend over the underlying drain fingers to increase the interconnect thickness and contact area of the gate bus 444. In this embodiment, the source bus 442-2 is interconnected to the underlying source metal, and source bus 442-2 does not comprise lateral extensions. Optionally these may be provided. As illustrated schematically in FIG. 8E, pad metal is provided on the drain bus, the source bus and the gate pads, and the die is passivated with a die passivation layer 404. Openings are provided in the die passivation 404 to the pad metal defining the external contact areas comprising the source pad 462, the drain pad 464, and first and second gate pads 466 at each end of the die. Optionally, by appropriate routing of the interconnect metallization of the source bus and gate bus, separate gate and gate return pads may be provided, e.g. as shown schematically in FIG. 9.

Figure 8E:
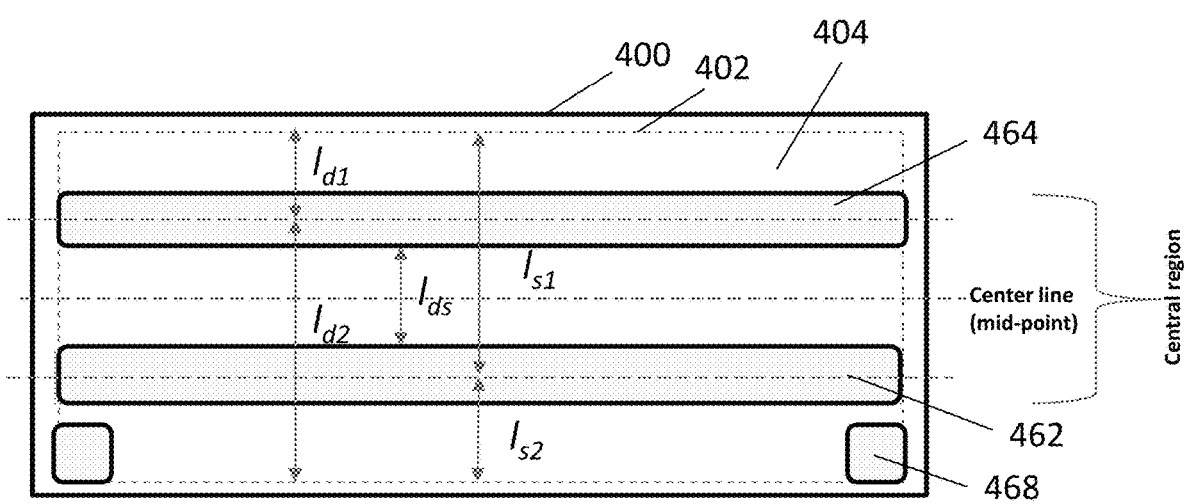

FIG. 8E shows some parameters relating to dimensions that may be used to define the device topology for optimization of the interconnect metal resistance. For example, based on a design objective to minimize the interconnect resistance, a suitable device model is chosen and the interconnect resistance is computed based on the type of interconnect metal, and interconnect metal dimensions and other parameters (e.g. trace length, width, thickness, et al.), which contribute to interconnect resistance, taking into account applicable design rules, which may include minimum and maximum allowable values of parameters. Assuming other parameters are constant, the interconnect resistance can be computed for placement of the source and drain buses at the peripheral edges of the die as is conventional, and for placement of the source and drain buses closer to the centre of the die as illustrated in FIG. 8E. In an ideal case, the source and drain buses would be placed as close to the centreline as possible, to minimize both source and drain resistances, as illustrated schematically in FIG. 4. Thus, the drain and source buses are moved away from first and second edges of the active area of the die, into the middle part (center region) of the active area of the die. In practice, for devices operating at high voltage, e.g. ≥80V, the source and drain pads are positioned to provide a required minimum separation $l_{ds}$ between the source pad and the drain pad. The spacing $l_{ds}$ is selected to comply with interconnect-metallization design rules, dependent on the operational voltage differential between the source pad and drain pad. For example, for 650V operation, to meet creepage requirements, a minimum required separation distance between the source pad and the drain pad may be e.g. ≥300 µm. In practice a larger separation, e.g. 450 µm to 500 µm may be preferable. For lower voltage operation, e.g. for 80V or 100V operation, a smaller spacing $l_{ds}$, e.g. 50 µm, may provide adequate separation of the source and drain pads with respect to electric field, to comply with creepage requirements, but in practice other design rules for fabrication and device packaging, or other manufacturing constraints, may require a larger minimum spacing between the source pad and the drain pad, e.g. in a range of ~200 µm to ~250 µm. The placement of the source and drain pads may be based on centre-to-edge distances, as illustrated schematically in FIG. 8E.

Alternatively, the spacings of the source and drain contact pads may be specified as edge-to-edge distances as illustrated schematically in FIG. 5 with references to placing the drain pad a first distance from a first edge of the active area of the die, placing the source pad a second distance from a second edge of the active area of the die, with a third distance between the source pad and the drain pad.

By way of example, in a device structure of an example embodiment, a first spacing of the drain bus from a first edge of the die is in a range of 20% to 30% of the die width and the second spacing of the source bus from a second edge of the die is in a range of 20% to 30% of the die width, as shown schematically in FIG. 8E. For example, splitting the lengths of the source metal interconnect $l_{s1}$ and $l_{s2}$ in a 25%/75% ratio or a 30%/70% ratio, reduces the source interconnect resistance relative to conventional placement of the source pad at the periphery of the active area of the die, and splitting the lengths of the drain metal interconnect $l_{d1}$ and $l_{d2}$ in a 25%/75% ratio or a 30%/70% ratio, reduces the drain interconnect resistance relative to conventional placement of drain pad at the periphery of the active area of the die. The source pad and drain pad are separated by at least a minimum required distance $l_{ds}$. In the example illustrated schematically in FIG. 8E, the source pad and the drain pad have a width of e.g. 200 µm, and they are each size of a centerline of the die, spaced apart by a distance $l_{ds}$ of e.g. 500 µm. The source pad and the drain pad may be spaced symmetrically or asymmetrically each size of the centerline. For example, in a device structure of one example embodiment, optimized to reduce or minimize interconnect resistance for an operational voltage of 600V, for a die with an active area having a width of 1750 µm, wherein the source pad and the drain pad each have a width of 253 µm, the source pad and drain pad were separated by a distance $l_{ds}$ of 506 µm, and the other spacings were: $l_{d1}$ 405 µm, $l_{d2}$ 1345 µm, $l_{s1}$ 1230 µm, $l_{s2}$ 520 µm. These dimensions split lengths of the first and second portions of the drain metal interconnect $l_{d1}$ and $l_{d2}$ in a ratio of about 23%/77% and split lengths of the first and second portions of the source metal interconnect $l_{s1}$ and $l_{s2}$ in a ratio of about 70%:30%.

Since the source bus and drain bus do not occupy area at the periphery of the die, the active area and the source and drain electrodes may extend to the edges of the die, offering more active area per die of a specific size, e.g. 5% or more active area per die, or by allowing for the die size to be reduced, providing a larger number of die per wafer, thereby reducing cost per die.

Figure 9:
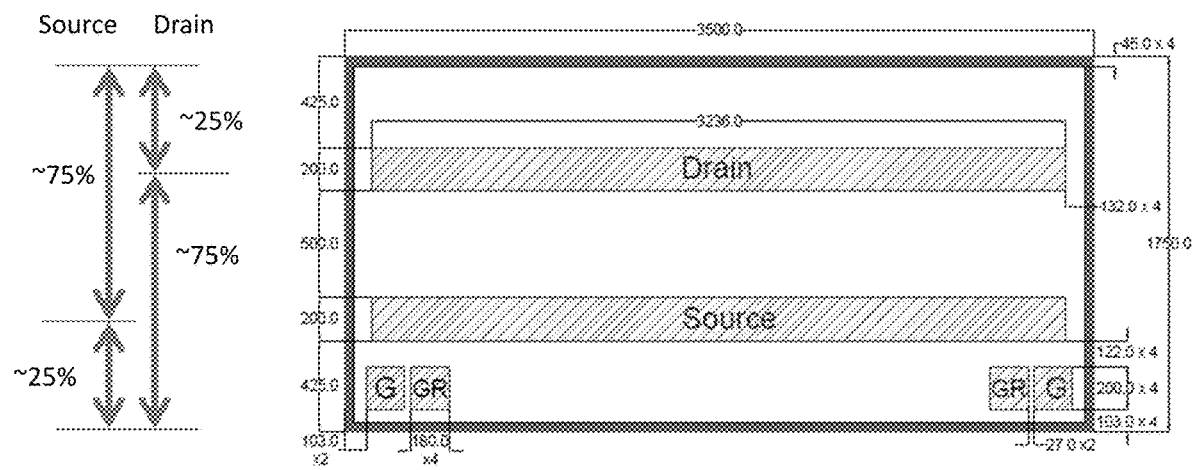
FIG. 9 shows a schematic diagram of a plan view of a semiconductor device structure comprising a lateral GaN power transistor having device topology of an example embodiment of a specific die size, with interconnect dimensions optimized to meet a specified design requirement to reduce both source and drain interconnect resistances.

FIG. 9 shows a schematic diagram of a plan view of a semiconductor device structure comprising a lateral GaN power transistor having device topology of another example embodiment of a specific die size, with interconnect dimensions optimized to meet a specified design objective to reduce on-chip source and drain interconnect resistances. That is, in the example embodiment for a lateral GaN power transistor, such as a GaN HEMT, where the 2DEG source-drain channel region has very low on-resistance per unit area, the resistance of on-chip metal interconnect is reduced by ~15% by centralized placement of the source and drain pads as shown in FIG. 9, compared to a conventional arrangement of source and drain pads at the periphery of the die (e.g. as shown schematically in FIGS. 1A and 1B).

The minimum separation of the source bus and the drain bus for 650V operation would typically be at least 300 µm, and in this example a separation (spacing $l_{ds}$ in FIG. 8E) of 500 µm was selected. The source pad and drain pad each have a width of ~200 µm (e.g. in a range of 200 µm to 275 µm (8 to 11 mil)). For example, for wirebonding using bondwires of a specific diameter e.g. 25 µm to 75 µm (1 to 3 mil), a bond pad width of at least 2× the wire diameter is typically used. So, using these example constraints, each of the drain bus and the source bus are spaced 380 µm from the first and second edges of the active area, or 450 µm from the die edges. That is, the contact pads for the drain bus and the source bus are placed in the middle part (centre region) of the active area to split the first and second portions of source the interconnect length and the drain interconnect length in an approximately 25%:75% ratio.

Figure 10:
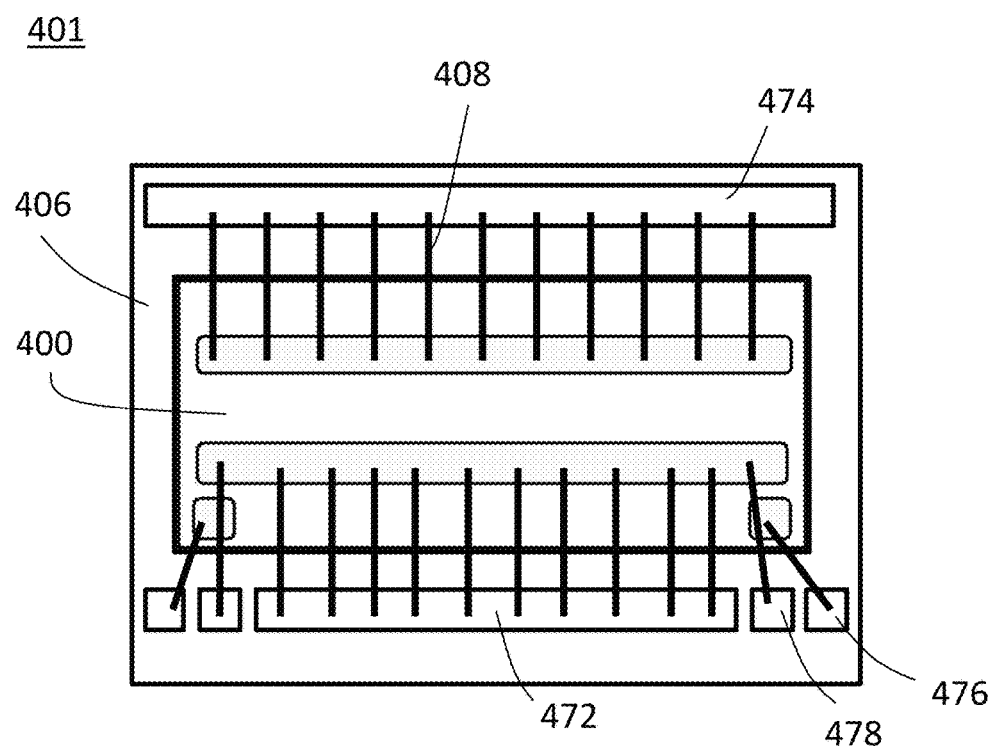
FIG. 10 shows a schematic diagram of an assembly of the semiconductor device structure of FIG. 8 and a wirebonded package.

Typically, in conventional wirebonded packaging, the bondpads are provide around the periphery of the die so that the shortest bondwire length can be used for reduced bondwire impedance. As illustrated schematically in FIG. 10, which shows a schematic of an assembly of the semiconductor device structure of FIG. 9 and a wire bonded package, longer bondwires are needed. However, as mentioned above, using multiple bondwires reduces bondwire resistance and inductance, so that the bondwires do not contribute significantly to the total resistance of the packaged device. For wirebonded connections to the gate and gate return pads, which carry smaller currents, smaller sized contact pads, and smaller diameter bondwires may be used.

For a specified die size, by moving the source pad towards the centre of the active area, source interconnect inductance and resistance, Ls and Rs, are reduced, and by moving the drain pad towards the centre of the active area, drain interconnect inductance and resistance, Ld and Rd, are reduced. The source and drain pads are ideally placed as close as possible to the centreline, but in practice there is a minimum required separation between the source and drain pads dependent on interconnect metallization design rules and operational voltage, e.g. ≥300 µm for 650V operation. The pad metal for the external contact pads for the source and drain is formed on the source bus and drain bus. Lateral routing of current from the source and drain finger electrodes to/from the source and drain buses is provided by the first and second level interconnect metallization. Centralized placement of the source bus and drain bus, e.g. as shown in FIG. 9, provides a shorter current path in both the source interconnect metal and drain interconnect metal, as explained with reference to the schematic diagrams shown in FIGS. 3 and 4.

Figure 11:
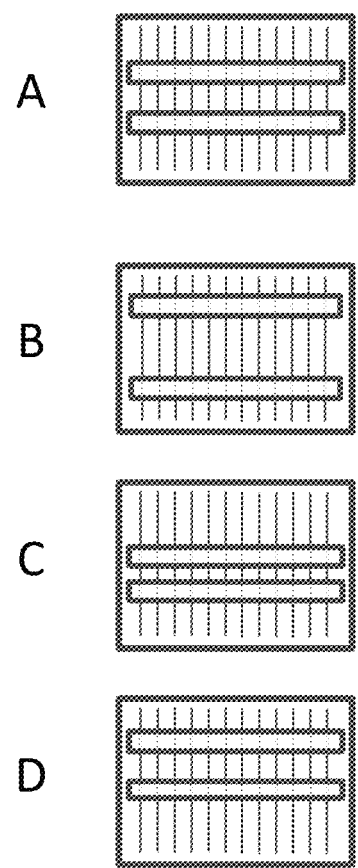
FIG. 11 shows some simplified schematic diagrams to illustrate example device topologies with different external contact pad placements.
Figure 12:
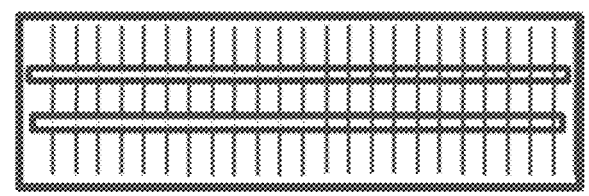
FIG. 12 shows a simplified schematic diagram to illustrate an example device topology with a different aspect ratio.

FIG. 11 shows some simplified schematic views A to D of power semiconductor device structures of other example embodiments, where for a die of a specific aspect ratio, the locations of the source and drain pads are varied. In the device structure FIG. 11A, the source and drain pads are positioned at a distance from the first and second die edges, e.g. a distance of ≥20% of the die width to reduce die interconnect resistance. Placing the source and drain pads towards the die edges, e.g. a distance of ~10% of the die width as shown schematically in FIG. 11B, may not sufficiently reduce die interconnect resistance. Placing the source and drain pads further towards die centreline, as shown schematically in FIG. 11C, may theoretically reduce die interconnect resistance, but this structure may violate other design rules, such as a minimum required separation between the source pad and the drain pad to provide a minimum required creepage distance. In the embodiments described, the source pad and the drain pad may be symmetrically or asymmetrically placed relative to a centre line of the die, to optimize interconnect resistance for both the source interconnect and the drain interconnect. In device structures of other embodiments, placements of the source pad and drain pad may be optimized independently for only one of the source and drain interconnect resistance, and the source pad and the drain pad may be asymmetrically placed relative to a centerline of the die. For example, in the device structure shown schematically in FIG. 11D, the source pad may be centered to optimize source resistance, and the drain pad is spaced at minimum required separation from the source pad, as described in the above referenced related U.S. application Ser. No. 17/117,449. In another example, to illustrate scalability, FIG. 12 shows a simplified schematic view of a power semiconductor device structure of another example embodiment, for a die of a different aspect ratio, which provides a large gate width per unit area, with low source and drain interconnect resistance. This die has a similar width to those shown in FIG. 11, but the length of the die is increased to add more "building blocks" based on the device structure shown in FIG. 11A, to increase the gate length, while maintaining a short current path, and therefore low resistance, for the source and drain interconnect metal.

Using a device topology as disclosed herein, in which the source and drain buses and corresponding external bond pads extend across the active region at positions intermediate first and second edges of the die, e.g. the pads centralized over the active area, the metal interconnect contribution to the total die resistance can be reduced significantly. For a given die size, centralized placement of the source and drain pads provides shorter current paths, wherein drain current and source current are distributed laterally in two directions in the source and drain interconnect metal. Accordingly, one or more of the following advantages or benefits may be realized, e.g.:

Increasing the current rating for the same sized die, i.e. higher current per unit area.
Reduction in die size to meet a targeted resistance value;
Increasing the number of die per wafer (reduced size and cost per die)
Increasing reliability-reliability is inversely proportional to die size;
For a given die size, increasing active area usage;
For a given die size, reducing a maximum current density in the die metal interconnect;

Specific embodiments have been described for lateral power semiconductor devices comprising lateral GaN HEMTs. The 2DEG channel of these devices inherently has a very low on-resistance. Thus, when using conventional interconnect structures with source and drain pads arranged around the periphery of the die, the resistance of interconnect structure may contribute significantly to total device resistance. In alternative embodiments, the power semiconductor device may comprise a lateral GaN diode wherein the anode and cathode interconnect structures are correspondingly structured, with the anode and cathode contact pads in a central region of the active area of the die.

The device topologies and interconnect structures disclosed herein may be applicable to other lateral power semiconductor devices, e.g. lateral power transistors and lateral power diodes fabricated with other semiconductor technologies, e.g. other types of lateral power HEMTs, lateral power FETs, lateral power MOSFETs, lateral power diodes, et al, fabricated with semiconductor technologies based on e.g. GaN, SiC and other wide bandgap semiconductor technologies or Si technology. Thus, while specific embodiments have been described with reference to a lateral GaN HEMT comprising source, drain and gate electrodes and interconnect structures, for these and other lateral power transistor devices, the source and drain electrodes and source and drain interconnect structures may be referred to as first and second electrodes and first and second interconnect structures, and the gate electrodes and interconnect structure may be referred to as third electrodes or control electrodes and third interconnect structure. In a lateral power diodes, the first and second electrodes and interconnect structures may be referred to as first and second electrodes and first and second interconnect structures. For example, for various types of lateral power transistors, the first, second and third electrodes and their respective interconnect structures may be referred to as: source, drain and gate; emitter, collector and gate; emitter, collector and base; source, collector and gate; anode, cathode and gate; and combinations thereof. The device topologies disclosed herein are particularly applicable to power semiconductor device structures, such as GaN HEMTs, wherein the on-resistance of the channel region is inherently low, and a conventional die interconnect structure contributes significantly to the total device resistance, e.g. ≥30%. For power semiconductor devices fabricated with materials and device structures wherein the channel resistance is higher, so the die interconnect structure contributes less to the total device resistance, there would be limited motivation or advantage to using the interconnect structure disclosed herein to reduce die resistance.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. A power semiconductor device structure comprising a lateral GaN HEMT wherein:
    drain, source and gate finger electrodes of the lateral GaN HEMT extend between first and second edges of an active region of a substrate,
    a drain interconnect metal finger contacts each drain finger electrode;
    a source interconnect metal finger contacts each source finger electrode;
    a single source bus elongated across the active region at a position intermediate the first and second edges of the active region, the source bus interconnecting first and second portions of each of the source interconnect metal fingers which extend laterally towards the first and second edges of the active region, there being no other source bus that is elongated across the active region at any position intermediate the first and second edges of the active region and that interconnects the source interconnect metal fingers;
    a single drain bus elongated across the active region at a position intermediate the first and second edges of the active region, the draining bus interconnecting first and second portions of each of the drain interconnect metal fingers which extend laterally towards the first and second edges of the active region, there being no other drain bus that is elongated across the active region at any position intermediate the first and second edges of the active region and that interconnects the drain interconnect metal fingers;
    a source contact pad is provided on the source bus;
    a drain contact pad is provided on the drain bus; and
    a gate bus interconnects gate finger electrodes to a gate pad.

2. The power semiconductor device structure of claim 1, wherein said positions intermediate the first and second edges of the active region are on a central region each side of a centreline of the active region.

3. The power semiconductor device structure of claim 1, wherein the source bus and the drain bus run across a central region the active region, and the source contact pad and the drain contact pad are separated by a distance which is at least a minimum specified distance to comply with creepage requirements for a rated operational voltage.

4. The power semiconductor device structure of claim 1, wherein the source bus and the drain bus run across a central region of the active region, the source contact pad being spaced a first distance from the first edge and the drain contact pad being spaced a second distance from the second edge, said first and second distances being at least a width of the source contact pad and the drain contact pad.

5. The power semiconductor device structure of claim 1, wherein the source bus and the drain bus run across a central region of the active region, the source contact pad being spaced a first distance from the first edge and the drain contact pad being spaced a second distance from the second edge, said first and second distances being a significant part of a distance between the first and second edges of the active region to meet a design requirement for a resistance of the source and drain interconnect metallization.

6. The power semiconductor device of claim 5, wherein said first and second distances are optimized to reduce resistance of the source interconnect metal and drain interconnect metal while maintaining at least a minimum specified distance between the drain contact pad and the source contact pad to comply with creepage requirements for a rated operational voltage.

7. The power semiconductor device of claim 6, wherein the rated operational voltage is one of: ≥80V; ≥100V; ≥200V; ≥600V; and ≥1200V.

8. The power semiconductor device structure of claim 5, wherein said design requirement is to minimize resistances of the drain interconnect metal and source interconnect metal while maintaining at least a minimum specified distance between the drain contact pad and the source contact pad to comply with creepage requirements for a rated operational voltage.

9. The power semiconductor device structure of claim 1, wherein the source bus and the drain bus are positioned in a central region of the active region, the source bus being spaced a first distance from the first edge and the drain bus being spaced a second distance from the second edge, wherein said first and second distances are ≥20% of a distance between the first and second edges of the active region.

10. The power semiconductor device structure of claim 9, wherein the source bus and the drain bus are separated by a third distance which is at least a minimum specified distance for operation at a rated operational voltage of ≥80V.

11. The power semiconductor device structure of claim 9, wherein the source bus and the drain bus are separated by a third distance which is at least a minimum specified distance for operation at a rated operational voltage of ≥100V.

12. The power semiconductor device structure of claim 9, wherein the source bus and the drain bus are separated by a third distance which is at least a minimum specified distance for operation at a rated operational voltage of ≥600V.

13. The power semiconductor device of claim 1, wherein current path lengths of the first and second portions of the drain metal interconnect and current path lengths of the first and second portions of the source metal interconnect are optimized to reduce resistance of the source metal interconnect and the drain metal interconnect while maintaining at least a minimum specified distance between the drain contact pad and the source contact pad to comply with design rules comprising creepage requirements for a rated operational voltage.

* * * * *